US009685122B2

(12) United States Patent
Lim et al.

(10) Patent No.: US 9,685,122 B2
(45) Date of Patent: Jun. 20, 2017

(54) PIXEL CIRCUIT AND DISPLAY DEVICE HAVING THE SAME

(71) Applicant: Samsung Display Co., Ltd., Yongin, Gyeonggi-do (KR)

(72) Inventors: Ji-Hun Lim, Goyang-si (KR); Hyeon-Sik Kim, Yongin-si (KR); Yeon-Gon Mo, Yongin-si (KR); Byung-Du Ahn, Hwaseong-si (KR); Hyang-Shik Kong, Seongnam-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 300 days.

(21) Appl. No.: 14/548,124

(22) Filed: Nov. 19, 2014

(65) Prior Publication Data

US 2015/0145840 A1    May 28, 2015

(30) Foreign Application Priority Data

Nov. 26, 2013    (KR) ......................... 10-2013-0144197

(51) Int. Cl.
    *G09G 3/36*    (2006.01)
    *G09G 3/02*    (2006.01)
    (Continued)

(52) U.S. Cl.
    CPC ............. *G09G 3/3607* (2013.01); *G09G 3/02* (2013.01); *H01L 27/1225* (2013.01);
    (Continued)

(58) Field of Classification Search
    CPC ....... G09G 2360/14–2360/148; G09G 3/3607; G06F 3/042–3/048
    (Continued)

(56) References Cited

U.S. PATENT DOCUMENTS 6,753,912 B1    6/2004    Wayne
7,623,112 B2 *  11/2009   Chen ................... G09G 3/3648
                                                    178/18.01

(Continued)

FOREIGN PATENT DOCUMENTS

JP        5196963 B2      2/2013
KR    10-2001-0039849 A   5/2001

(Continued)

OTHER PUBLICATIONS

Jeon et al., "Gated three-terminal device architecture to eliminate persistent photoconductivity in oxide semiconductor photosensor arrays," *Nature Materials*, vol. 11, Apr. 2012, www.nature.com/naturematerials, pp. 301-305.

(Continued)

*Primary Examiner* — David Tung
(74) *Attorney, Agent, or Firm* — Knobbe, Martens, Olson & Bear, LLP

(57) ABSTRACT

A pixel circuit and a display device having the pixel circuit are disclosed. One inventive aspect includes a switching thin-film TFT and a light sensing TFT. The switching thin-film TFT includes a first source electrode electrically connected to a data line. A first gate electrode of the switching thin-film TFT and a second source electrode of the light sensing TFT are electrically connected to a first gate line. A first drain electrode of the switching thin-film TFT and a second drain electrode of the light sensing TFT are electrically connected to a pixel electrode.

17 Claims, 9 Drawing Sheets

(51) Int. Cl.
*H01L 27/144* (2006.01)
*H01L 27/12* (2006.01)
*H01L 29/786* (2006.01)
*G06F 3/041* (2006.01)
*G06F 3/042* (2006.01)

(52) U.S. Cl.
CPC ...... *H01L 27/1446* (2013.01); *H01L 29/7869* (2013.01); *G06F 3/042* (2013.01); *G06F 3/0412* (2013.01); *G09G 3/3648* (2013.01); *G09G 2300/0809* (2013.01); *G09G 2360/141* (2013.01); *G09G 2360/142* (2013.01); *G09G 2360/144* (2013.01); *G09G 2360/145* (2013.01); *H01L 27/1251* (2013.01)

(58) Field of Classification Search
USPC ............ 345/207, 690–699, 87–103; 349/116
See application file for complete search history.

(56) References Cited

U.S. PATENT DOCUMENTS

| | | | |
|---|---|---|---|
| 7,924,378 B2 | 4/2011 | Chen et al. | |
| 8,379,005 B2 | 2/2013 | Sano et al. | |
| 8,928,629 B2* | 1/2015 | Chung | G06F 3/042 345/175 |
| 2003/0076295 A1* | 4/2003 | Nakajima | G06F 3/03545 345/156 |
| 2004/0021059 A1 | 2/2004 | Spears | |
| 2005/0231656 A1* | 10/2005 | den Boer | H01L 27/14609 349/42 |
| 2006/0132463 A1 | 6/2006 | Lee et al. | |
| 2007/0046619 A1 | 3/2007 | Sano et al. | |
| 2007/0070056 A1* | 3/2007 | Sato | G06F 3/0412 345/207 |
| 2007/0290971 A1* | 12/2007 | Shih | G09G 3/3648 345/90 |
| 2008/0143942 A1* | 6/2008 | Chen | G01J 1/46 349/116 |
| 2009/0051645 A1* | 2/2009 | Chen | G02F 1/13338 345/104 |
| 2009/0141224 A1 | 6/2009 | Ito et al. | |
| 2009/0185095 A1* | 7/2009 | Kim | G02F 1/134309 349/48 |
| 2010/0020009 A1 | 1/2010 | Nakanishi | |
| 2010/0039406 A1* | 2/2010 | Lee | G02F 1/13338 345/174 |
| 2010/0253614 A1* | 10/2010 | Chen | G01J 1/32 345/102 |
| 2011/0063252 A1* | 3/2011 | Chang | G06F 3/0412 345/175 |
| 2011/0169772 A1* | 7/2011 | Liu | G06F 3/0412 345/175 |
| 2011/0248973 A1 | 10/2011 | Kuhlman et al. | |
| 2013/0063400 A1* | 3/2013 | Ahn | H01L 27/14609 345/175 |
| 2014/0098311 A1 | 4/2014 | Lim et al. | |

FOREIGN PATENT DOCUMENTS

| | | |
|---|---|---|
| KR | 10-2003-0009840 A | 2/2003 |
| KR | 10-2006-0062164 A | 6/2006 |
| KR | 10-2013-0028581 A | 3/2013 |

OTHER PUBLICATIONS

Liu et al., "Charge pumping method for photosensor application by using amorphous indium-zinc oxide thin film transistors," *Applied Physics Letters*, 94, 242101 (2009), pp. 242101-1-242101-3.

* cited by examiner

PIXEL CIRCUIT AND DISPLAY DEVICE HAVING THE SAME

CROSS-REFERENCE TO RELATED APPLICATIONS

This application claims priority under 35 USC §119 to Korean Patent Applications No. 10-2013-0144197, filed on Nov. 26, 2013 in the Korean Intellectual Property Office (KIPO), the contents of which are incorporated herein in its entirety by reference.

BACKGROUND

Field

The described technology generally relates to a pixel circuit having a light sensing sensor for controlling a pixel based on brightness of external light, and a display device having the pixel circuit.

Description of the Related Technology

Recently, various techniques have been developed to make use of a light sensor in display devices. For example, a display device can sense a touch using the light sensor. The display device having the light sensor senses a change of light when a display panel of the display device is touched by a user hand, a touch pen, etc. The display device that senses the touch receives a touch signal from the light sensor. The touch signal includes the touch information such as a touch position.

SUMMARY OF CERTAIN INVENTIVE ASPECTS

One inventive aspect of the disclosed technology is a pixel circuit capable of controlling the grayscale of a pixel according to brightness of external light.

Another inventive aspect of the disclosed technology is a display device having the pixel circuit.

One inventive aspect is a switching thin-film transistor (TFT) and a light sensing TFT. The switching thin-film TFT can include a first gate electrode electrically connected to a first gate line, a first source electrode electrically connected to a data line, and a first drain electrode electrically connected to a pixel electrode. The light sensing TFT can include a second gate electrode electrically connected to a second gate line, a second source electrode electrically connected to the first gate line, and a second drain electrode electrically connected to the first drain electrode and the pixel electrode.

In one exemplary embodiment, the light sensing TFT is configured to control the grayscale of a pixel having the pixel electrode according to brightness of external light.

In another exemplary embodiment, the light sensing TFT is configured to increase a pixel voltage applied to the pixel electrode as the brightness of the external light decreases, and to decrease the pixel voltage as the brightness of the external light increases.

In another exemplary embodiment, a gate voltage applied to the second gate electrode has a predetermined voltage level such that the light sensing TFT is turned off when an external light incident on the light sensing TFT has an intensity lower than a predetermined intensity.

In another exemplary embodiment, the gate voltage has a ground voltage level.

In another exemplary embodiment, the gate voltage has a negative voltage level.

In another exemplary embodiment, the switching TFT further includes a first active layer, and the light sensing TFT can further include a second active layer, and a first light reactivity of the first active layer can be lower than a second light reactivity of the second active layer.

In another exemplary embodiment, the first active layer includes an indium gallium zinc oxide (IGZO).

In another exemplary embodiment, the light sensing TFT further includes a second active layer that is conductive when the external light is applied.

In another exemplary embodiment, the second active layer is a single layer including a zinc (Zn) and at least one of an indium (In) or a tin (Sn).

In another exemplary embodiment, the second active layer includes a lower layer and an upper layer. The lower layer includes an IGZO. The upper layer disposed on the lower layer includes a zinc (Zn) and at least one of an indium (In) or a tin (Sn).

In another exemplary embodiment, the second active layer further includes an intermediate layer between the lower layer and the upper layer. A first electron affinity of the intermediate layer is higher than a second electron affinity of the upper layer.

One inventive aspect includes a display panel having a plurality of pixel circuits, a scan driving unit configured to provide a scan signal to the pixel circuits, a data driving unit configured to provide a data signal to the pixel circuits, and a timing control unit configured to control the scan driving unit and the data driving unit. Each of the pixel circuits can include a switching TFT and a light sensing TFT. The switching TFT can include a first gate electrode electrically connected to a first gate line, a first source electrode electrically connected to a data line, and a first drain electrode electrically connected to a pixel electrode. The light sensing TFT including a second gate electrode electrically connected to a second gate line, a second source electrode electrically connected to the first gate line, and a second drain electrode electrically connected to the first drain electrode and the pixel electrode.

In one exemplary embodiment, the light sensing TFT is configured to control the grayscale of a pixel having the pixel electrode according to brightness of external light.

In another exemplary embodiment, the light sensing TFT is configured to increase a pixel voltage applied to the pixel electrode as the brightness of the external light decreases, and to decrease the pixel voltage as the brightness of the external light increases.

In another exemplary embodiment, a gate voltage applied to the second gate electrode has a predetermined voltage level such that the light sensing TFT is turned off when an external light incident on the light sensing TFT has an intensity lower than a predetermined intensity.

In another exemplary embodiment, the light sensing TFT further includes a second active layer that is conductive when the external light is applied.

In another exemplary embodiment, the second active layer is a single layer including a zinc (Zn) and at least one of an indium (In) or a tin (Sn).

In another exemplary embodiment, the second active layer includes a lower layer and an upper layer. The lower layer includes an IGZO. The upper layer formed on the lower layer includes a zinc (Zn) and at least one of an indium (In) or a tin (Sn).

In another exemplary embodiment, the second active layer further includes an intermediate layer between the lower layer and the upper layer. A first electron affinity of the intermediate layer is higher than a second electron affinity of the upper layer.

Therefore, a pixel circuit according to some exemplary embodiments controls the grayscale of a pixel according to brightness of external light by including a light sensing TFT.

In addition, a display device having the pixel circuit can use a light device such as a laser pointer as a remote input device that is possible to control the display device without direct touch, because the grayscale of the pixel exposed to the external light can be inverted.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF CERTAIN INVENTIVE EMBODIMENTS

Exemplary embodiments will be described more fully hereinafter with reference to the accompanying drawings, in which various embodiments are shown.

Figure 1:
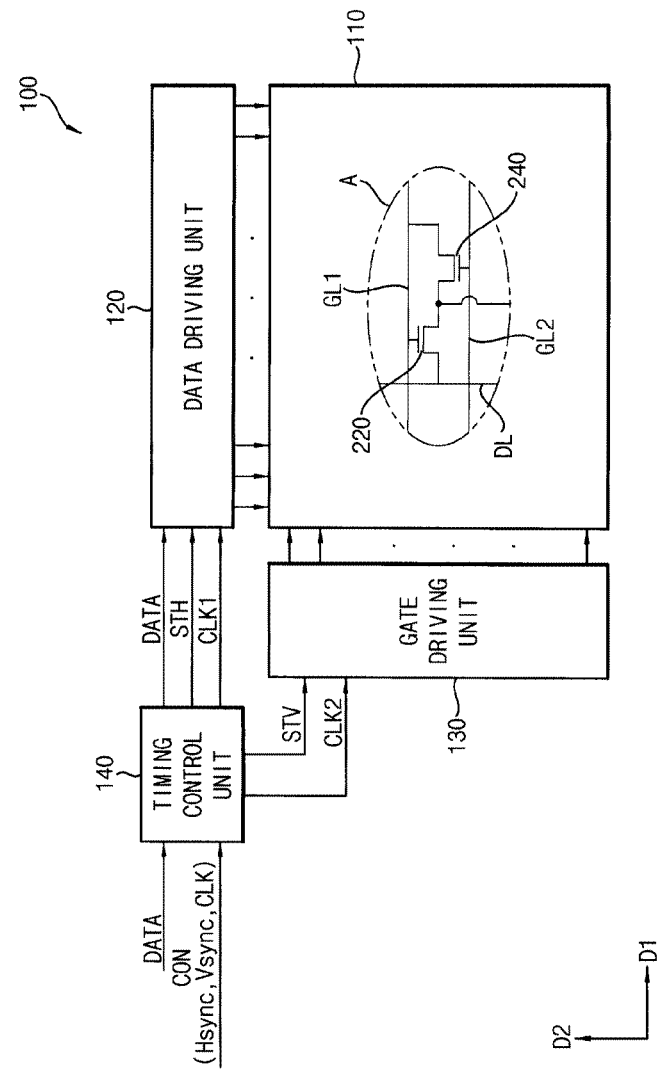
FIG. 1 is a block diagram illustrating a display device according to exemplary embodiments.

FIG. 1 is a block diagram illustrating a display device according to exemplary embodiments.

Referring to FIG. 1, the display device 100 includes a display panel 110, a data driving unit or data driver 120, a gate driving unit or gate driver 130, and a timing control unit or controller 140.

The display panel 110 receives an image data DATA to display an image. The display panel 110 includes a plurality of first gate lines GL1 and second gate lines GL2 substantially parallel with a first direction D1, a plurality of data lines DL substantially parallel with a second direction D2 substantially perpendicular to the first direction D1, and a plurality of pixels. In some exemplary embodiments, the first direction D1 is substantially parallel with a long side of the display panel 110. The second direction D2 is substantially parallel with a short side of the display panel 110.

Each of pixel circuits included in the display panel 110 includes a switching thin-film transistor (TFT) 220 and a light sensing TFT 240.

The switching TFT 220 includes a first gate electrode electrically connected to the first gate line GL1, a first source electrode electrically connected to the data line DL, and a first drain electrode electrically connected to a pixel electrode. In one exemplary embodiment, the switching TFT 220 further includes a first active layer. The light sensing TFT 240 further includes a second active layer. Here, a first light reactivity of the first active layer is lower than a second light reactivity of the second active layer. By structures included in the display device 100 such as a light blocking layer, an external light may be prevented from entering the switching TFT 220. However, the switching TFT 220 may be exposed to an internal light such as a back light. Thus, the first active layer may include a material that is stable against light. In another exemplary embodiment, the first active layer included in the switching TFT 220 includes an indium gallium zinc oxide (IGZO).

The light sensing TFT 240 includes a second gate electrode electrically connected to a second gate line GL2, a second source electrode electrically connected to the first gate line GL1, and a second drain electrode electrically connected to the first drain electrode and the pixel electrode. The light sensing TFT 240 may control the grayscale of the pixel having the pixel electrode according to brightness of the external light. Here, the external light is a light irradiated from the outside of the display device 100 to the display device 100. The external light may be substantially equally irradiated to the entire pixel circuits, or may be unequally irradiated to the pixel circuits. In one exemplary implementation, the external light is a laser light irradiated to a portion of the display device 100 using laser pointer.

The light sensing TFT 240 may control a pixel voltage applied to the pixel electrode. In one exemplary embodiment, the light sensing TFT 240 increase the pixel voltage applied to the pixel electrode as the brightness of the external light decreases. The light sensing TFT 240 may decrease the pixel voltage as the brightness of the external light increases. Thus, the light sensing TFT 240 controls the pixel voltage in inverse proportion to the external light. In another exemplary embodiment, the gate voltage applied to the second gate electrode has a predetermined voltage level such that the light sensing TFT 240 is turned off when an external light incident on the light sensing TFT has an intensity lower than a predetermined intensity. Thus, the light sensing TFT 240 is turned off when the intensity of the external light is lower than the predetermined intensity.

In some exemplary embodiments, the light sensing TFT 240 further includes a second active layer that is conductive when the external light is applied. In one exemplary embodiment, the second active layer is a single layer, which includes a zinc (Zn) and at least one of an indium (In) or a tin (Sn). In another exemplary embodiment, the second active layer includes a lower layer and an upper layer. The lower layer may include an IGZO. The upper layer formed on the lower layer includes a zinc (Zn) and at least one of an indium (In) or a tin (Sn). In still another exemplary embodiment, the second active layer further includes an intermediate layer between the lower layer and the upper layer. The lower layer may include an IGZO. The lower layer may include a material that is a stable against light not to be affected by the internal light. A first electron affinity of the intermediate layer may be higher than a second electron affinity of the upper layer. An efficiency of the light sensing TFT 240 including the intermediate layer may be improved by reducing a bandgap between a conduction band minimum (CBM) and a valence band maximum (VBM). The upper layer formed on the intermediate layer may include a zinc (Zn) and at least one of an indium (In) or a tin (Sn).

The data driving unit 120 may output a data signal based on the image data DATA to the data lines DL in response to a first clock signal CLK1 and a horizontal start signal STH provided from the timing control unit 140.

The gate driving unit 130 may generate a first gate signal using a vertical start signal STV and a second clock signal SLK2 provided from the timing control unit 140. The gate driving unit 130 may output the first gate signal to the first gate line GL1.

The timing control unit 140 receives the image data DATA and a control signal CON from an external source. The control signal CON includes a horizontal synchronous signal Hsync, a vertical synchronous signal Vsync, and a clock signal CLK. The timing control unit 140 generates the horizontal start signal STH using the horizontal synchronous signal Hsync. The timing control unit 140 outputs the horizontal start signal STH to the data driving unit 120. In addition, the timing control unit 140 generates the vertical start signal STV using the vertical synchronous signal Vsync. The timing control unit 140 outputs the vertical start signal STV to the gate driving unit 130. In addition, the timing control unit 140 generates the first clock signal CLK1 and the second clock signal CLK2 using the clock signal CLK. The timing control unit 140 outputs the first clock signal CLK1 to the data driving unit 120. The timing control unit 140 outputs the second clock signal CLK2 to the gate driving unit 130.

Figures 2, 3:
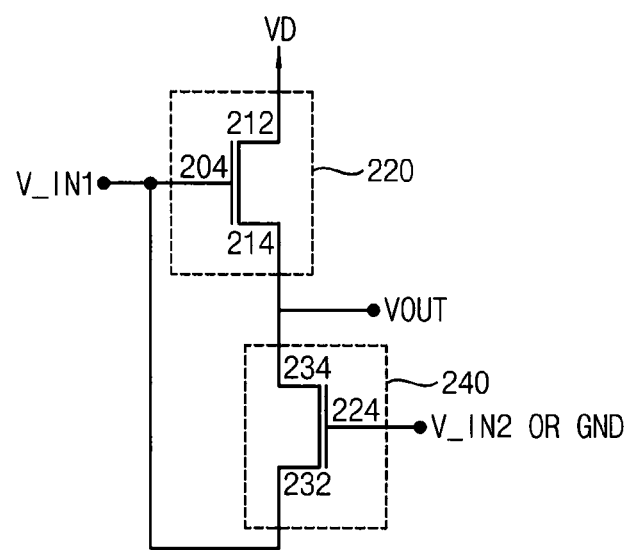
FIG. 2 is a circuit diagram illustrating a switching TFT and a light sensing TFT included in a display device of FIG. 1.
FIG. 3 is a truth table illustrating level of a pixel voltage in a pixel circuit of FIG. 2.

FIG. 2 is a circuit diagram illustrating a switching TFT and a light sensing TFT included in a display device of FIG. 1. FIG. 3 is a truth table illustrating level of a pixel voltage in a pixel circuit of FIG. 2.

Referring to FIGS. 2 and 3, the switching TFT 220 includes a first gate electrode 204, a first source electrode 212, and a first drain electrode 214. The light sensing TFT 240 includes a second gate electrode 224, a second source electrode 232, and a second drain electrode 234. The light sensing TFT 240 may control the grayscale of a pixel having the pixel electrode by controlling a pixel voltage applied to the pixel electrode according to brightness of external light. In one exemplary embodiment, the light sensing TFT 240 increases the pixel voltage as the brightness of the external light decreases. The light sensing TFT 240 decreases the pixel voltage as the brightness of the external light increases. In one exemplary embodiment, a second gate voltage V_IN2 is applied to the second gate electrode 224. The second gate voltage V_IN2 may have a predetermined voltage level such that the light sensing TFT 240 is turned off when an intensity of the external light incident on the light sensing TFT 240 is lower than a predetermined intensity. Therefore, the second gate voltage V_IN2 may be settled according to a characteristic of the second active layer. In one exemplary embodiment, the gate voltage has a ground voltage level. In another exemplary embodiment, the gate voltage has a negative voltage level.

The light sensing TFT 240 may be turned off when the intensity of the external light is lower than the predetermined intensity. In one exemplary implementation, when the first gate voltage V_IN1 of the first gate signal is applied to the first gate electrode 204 of the switching TFT 220 and the external light is not applied to the light sensing TFT 240, the switching TFT 220 is turned on and the light sensing TFT 240 is turned off. In this case, an output voltage VOUT applied to the pixel electrode has a first level corresponding to a data voltage VD of a data signal. In FIG. 3, when the external light is not applied to the light sensing TFT 240, if the first gate voltage V_IN1 is applied (i.e., V_IN1 is 1) and the data voltage VD is applied (i.e., VD is 1), then the output voltage VOUT has a logic high level (i.e., VOUT is 1). Likewise, when the external light is not applied to the light sensing TFT 240, if the first gate voltage V_IN1 is applied (i.e., V_IN1 is 1) and the data voltage VD is not applied (i.e., VD is 0), then the output voltage VOUT has a logic low level (i.e., VOUT is 0).

When the external light is applied to the light sensing TFT 240, the light sensing TFT 240 may be turned on and the pixel circuit may operate as an inverter with the data signal. When the external light is applied to the light sensing TFT 240 and the first gate voltage V_IN1 of the first gate signal is applied to the first electrode 204 of the switching TFT 220, the switching TFT 220 and the light sensing TFT 240 may be turned on. The second source electrode 232 of the light sensing TFT 240 may be electrically connected to the first gate line GL1. Therefore, the first gate voltage V_IN1 may be applied to the second source electrode 232 and the first gate voltage V_IN1 may have a negative voltage (i.e., −20V) in most of the period (i.e., 119/120). Therefore, when the external light is applied to the light sensing TFT 240, if the data voltage VD is applied to the data line (i.e., VD is 1), then the output voltage VOUT may have a logic low level (i.e., VOUT is 0) because the output voltage VOUT is a second level lower than the first level. Likewise, when the external light is applied to the light sensing TFT 240, if the data voltage VD is not applied to the data line (i.e., VD is 0), then the output voltage VOUT may have a logic high level (i.e., VOUT is 1) because the output voltage VOUT is a negative voltage and a potential difference is created. In other words, when the external light is applied to the light sensing TFT 240, if the first gate voltage V_IN1 is applied (i.e., V_IN1 is 1) and the data voltage VD is applied (i.e., VD is 1), then the output voltage VOUT has a logic low level (i.e., VOUT is 0). Also, if the first gate voltage V_IN1 is applied (i.e., V_IN1 is 1) and the data voltage VD is not applied (i.e., VD is 0), then the output voltage VOUT has a logic high level (i.e., VOUT is 1). Therefore, when the external light is applied to the light sensing TFT 240, the light sensing TFT 240 the pixel circuit may operate as an inverter with the data signal. The external light can be applied to a portion of the display device and image data outputted from the data lines DL can be inverted in portion of the pixel circuits on which the external light is applied.

Because a resistance of the light sensing TFT 240 decreases as the brightness of the external light increases, when the brightness of the external light is high, the pixel circuit may efficiently operate as the inverter with the data signal. Therefore, the light sensing TFT 240 may increase the pixel voltage as the brightness of the external light decreases, and may decrease the pixel voltage as the brightness of the external light increases.

Figure 4:
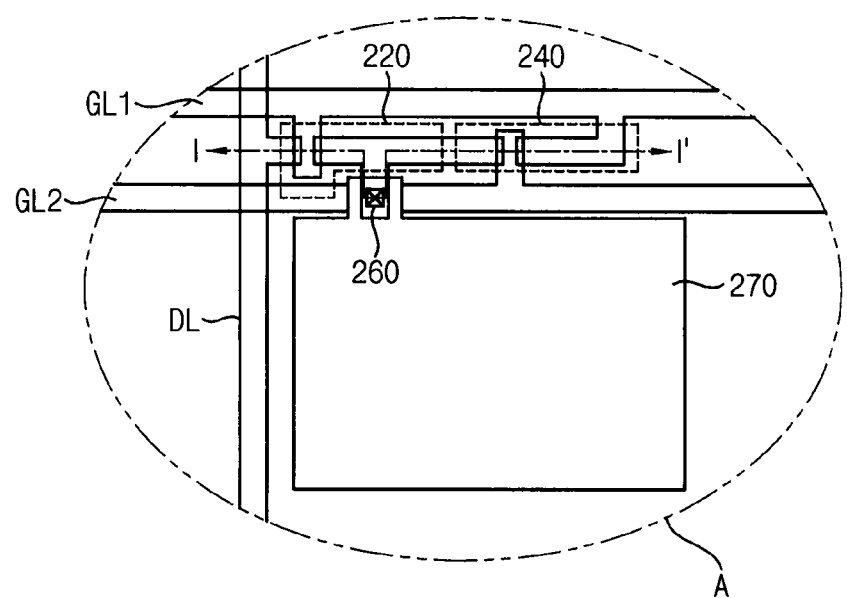
FIG. 4 is an enlarged view illustrating a portion 'A' of FIG. 1.
Figure 5A:
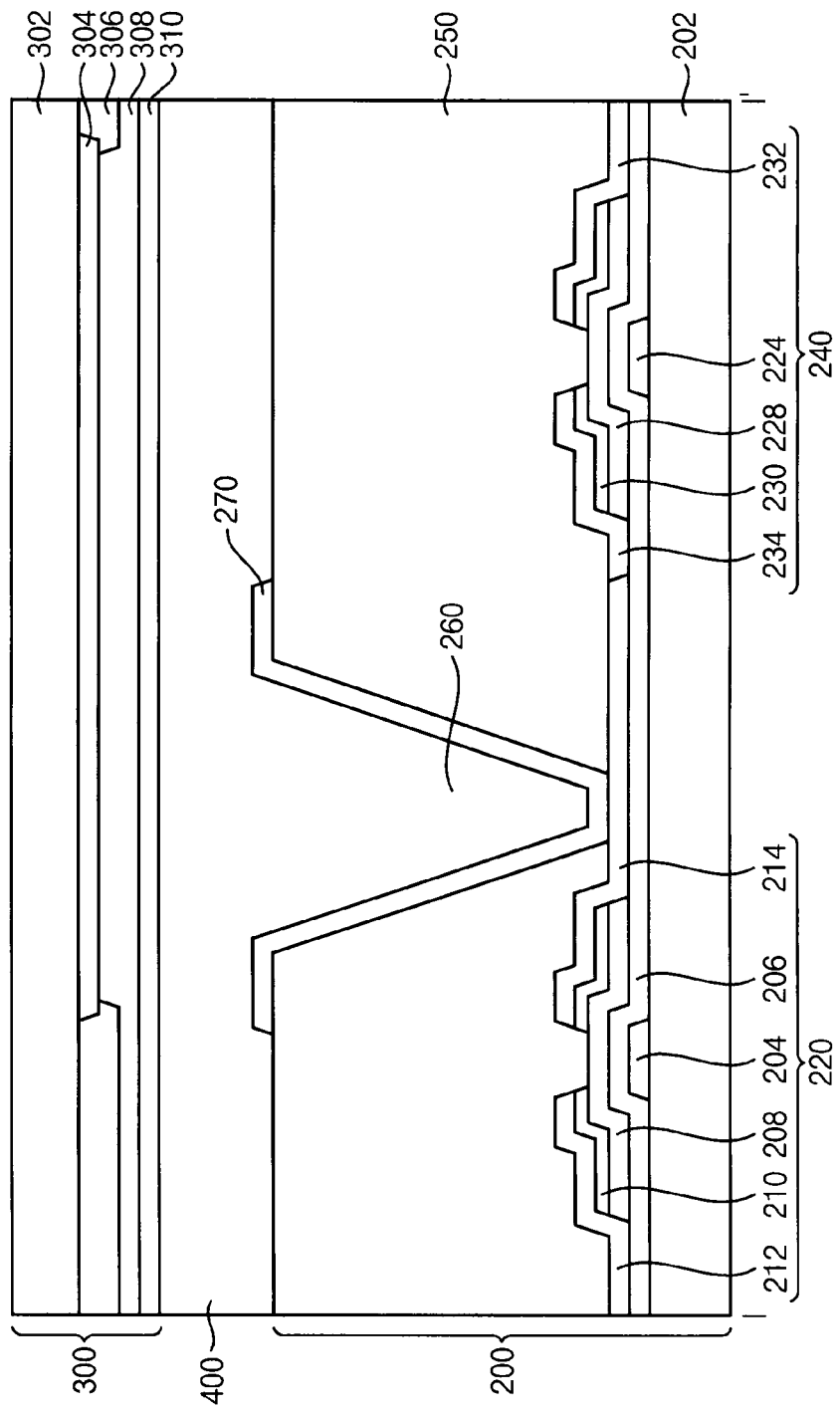
FIG. 5A is a cross-sectional view taken along a line I-I' of FIG. 4 according to exemplary embodiments.
Figure 5B:
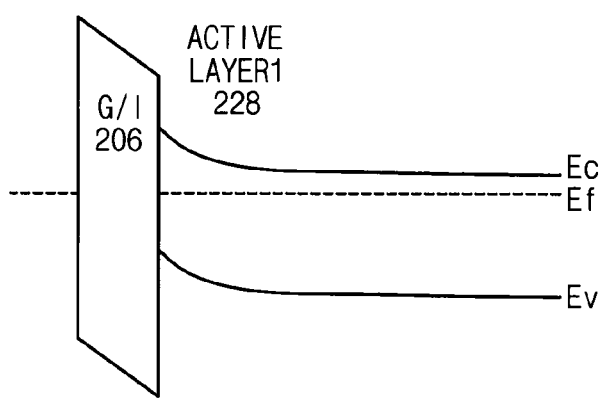
FIG. 5B is a diagram illustrating an exemplary implementation of an energy level according to positions in a second active layer of FIG. 5A.

FIG. 4 is an enlarged view illustrating a portion 'A' of FIG. 1. FIG. 5A is a cross-sectional view taken along a line I-I' of FIG. 4 according to an exemplary embodiment. FIG. 5B is a diagram illustrating another exemplary implementation of an energy level according to positions in a second active layer of FIG. 5A.

Referring to FIGS. 4 and 5A, the display panel may include a lower substrate 200, an upper substrate 300, and a liquid crystal layer 400.

The lower substrate 200 may include a first base substrate 202, a first gate line GL1, a second gate line GL2, a data line DL, a switching TFT 220, a light sensing TFT 240, an organic insulating layer 250, and a pixel electrode 270.

The first gate line GL1, the second gate line GL2, the data line DL, the switching TFT 220, and the light sensing TFT 240 may be formed on the first base substrate 202. In one exemplary embodiment, the first base substrate 202 may be a glass substrate. In another exemplary embodiment, the first base substrate 202 may be a plastic substrate.

The switching TFT 220 may include a first gate electrode 204, a gate insulating layer 206, a first active layer 208, a first ohmic-contact layer 210, a first source electrode 212, and a first drain electrode 214. The first gate electrode 204 may be formed on the first base substrate 202 and may be electrically connected to the first gate line GL1. The gate insulating layer 206 may be formed on the first gate electrode 204 and may insulate the first active layer 208 and the first gate electrode 204. The first active layer 208 may be formed on the gate insulating layer 206. The switching TFT 220 may be blocked from an external light by the light blocking layer 306. However, the switching TFT 220 may be exposed to an internal light such as a back light. Therefore, the first active layer 208 may include a material that has a low light reactivity. In one exemplary implementation, the first active layer included in the switching TFT 220 may include an indium gallium zinc oxide (IGZO). The first ohmic-contact layer 210 may be separately formed on the first active layer 208. The first source electrode 212 may be formed on the first ohmic-contact layer 210 and may be electrically connected to the data line DL. The first drain electrode 214 may be formed on the first ohmic-contact layer 210 and may be spaced apart from the first source electrode 212. The first drain electrode 214 may be electrically connected to the pixel electrode 270. The switching TFT 220 may be covered by the light blocking layer 306 in the upper substrate 300. Therefore, the switching TFT 220 may be operated without effect of the external light.

The light sensing TFT 240 may include a second gate electrode 224, the gate insulating layer 206, a second active layer 228, a second ohmic-contact layer 230, a second source electrode 232, and a second drain electrode 234. The second gate electrode 224 may be formed on the first base substrate 202 and electrically connected to the second gate line GL2. The gate insulating layer 206 may be formed on the second gate electrode 224 and may insulate the second active layer 228 and the second gate electrode 224. The second active layer 228 may be formed on the gate insulating layer 206. The second ohmic-contact layer 230 may be separately formed on the second active layer 228. The second source electrode 232 may be formed on the second ohmic-contact layer 230 and may be electrically connected to the first gate line GL1. The second drain electrode 234 may be formed on the second ohmic-contact layer 230 and may be spaced apart from the second source electrode 232. The second drain electrode 234 may be electrically connected to the first drain electrode 214 and the pixel electrode 270. The light sensing TFT 240 may be not covered by the light blocking layer in the upper substrate 300. Therefore, the light sensing TFT 240 may control the grayscale of the pixel according to brightness of the external light.

The organic insulating layer 250 is formed on the switching TFT 220 and the light sensing TFT 240 to protect the switching TFT 220 and the light sensing TFT 240.

The pixel electrode 270 is formed on the organic insulating layer 250. The pixel electrode 270 is electrically connected to the first drain electrode 214 of the switching TFT 220 through a contact hole 260 formed through the organic insulating layer 250. Thus, the pixel electrode 270 is electrically connected to the second drain electrode 234 of the light sensing TFT 240. In one exemplary embodiment, the pixel electrode 270 includes indium tin oxide (ITO). In another exemplary embodiment, the pixel electrode 270 includes indium zinc oxide (IZO).

The upper substrate 300 includes a second base substrate 302, a color filter layer 304, the light blocking layer 306, an over-coating layer 308, and a common electrode 310.

The second base substrate 302 faces the first base substrate 202. In one exemplary embodiment, the second base substrate 302 includes a glass substrate. In another exemplary embodiment, the second base substrate 302 includes a plastic substrate.

The color filter layer 304 and the light blocking layer 306 are formed on the second base substrate 302. The color filter layer 304 includes a red color filter, a green color filer, or a blue color filter. The light blocking layer 306 has a black matrix.

The over-coating layer 308 is formed on the color filter layer 304 and the light blocking layer 306. The over-coating layer 308 may flatten on the color filer layer 304 and the light blocking layer 306.

The common electrode 310 is formed on the over-coating layer 308. The common electrode 310 faces the pixel electrode 270 of the lower substrate 200. In one exemplary embodiment, the common electrode 310 includes ITO. In another exemplary embodiment, the common electrode 310 includes IZO. A pixel voltage applied to the pixel electrode 270 and a common voltage applied to the common electrode 310 may form an electric field.

The liquid crystal layer 400 may be interposed between the lower substrate 200 and the upper substrate 300, and may include the liquid crystal. An alignment of a liquid crystals in the liquid crystal layer 400 may be changed by the electric field formed by the pixel voltage applied to the pixel electrode 270 and the common voltage applied to the common electrode 310.

The second drain electrode 234 of the light sensing TFT 240 in the lower substrate 200 may be electrically connected to the pixel electrode 270. Thus, the light sensing TFT 240 controls a level of the pixel voltage applied to the pixel electrode 270 according to the brightness of the external light applied to the light sensing TFT 240.

Specifically, the second gate electrode 224 of the light sensing TFT 240 may be electrically connected to the second gate line GL2. The second source electrode 232 of the light sensing TFT 240 may be electrically connected to the first gate line GL1. A resistance of the light sensing TFT 240 decreases as the brightness of the external light increases. Therefore, the light sensing TFT 240 may increase the pixel voltage as the brightness of the external light decreases. Thus, the light sensing TFT 240 may increase the grayscale of the pixel including the pixel electrode 270 as the brightness of the external light applied to the light sensing TFT 240 decreases. Likewise, the light sensing TFT 240 may decrease the pixel voltage as the brightness of the external light increases. Thus, the light sensing TFT 240 may decrease the grayscale of the pixel including the pixel electrode 270 as the brightness of the external light applied to the light sensing TFT 240 increases.

Referring to FIG. 5B, the second active layer 228 of the light sensing TFT 240 may be conductive when the external light is applied to the light sensing TFT 240. In one exemplary embodiment, the second active layer 228 is a single layer. A work function of the second active layer 228 may be larger than a work function of the second gate electrode 224. A light reactivity of the light sensing TFT 240 may be improved by reducing a bandgap between a conduction band minimum Ec and a valence band maximum Ev of the second active layer 228. In addition, the second active layer 228 may include a material of which donor-like state density is high. Therefore, the second active layer 228 may include a material that has a high light reactivity to effectively control the grayscale of the pixel according to brightness of the external light. In one exemplary embodiment, the second active layer 228 may be a single layer including a zinc (Zn) and at least one of an indium (In) or a tin (Sn).

Figure 6A:
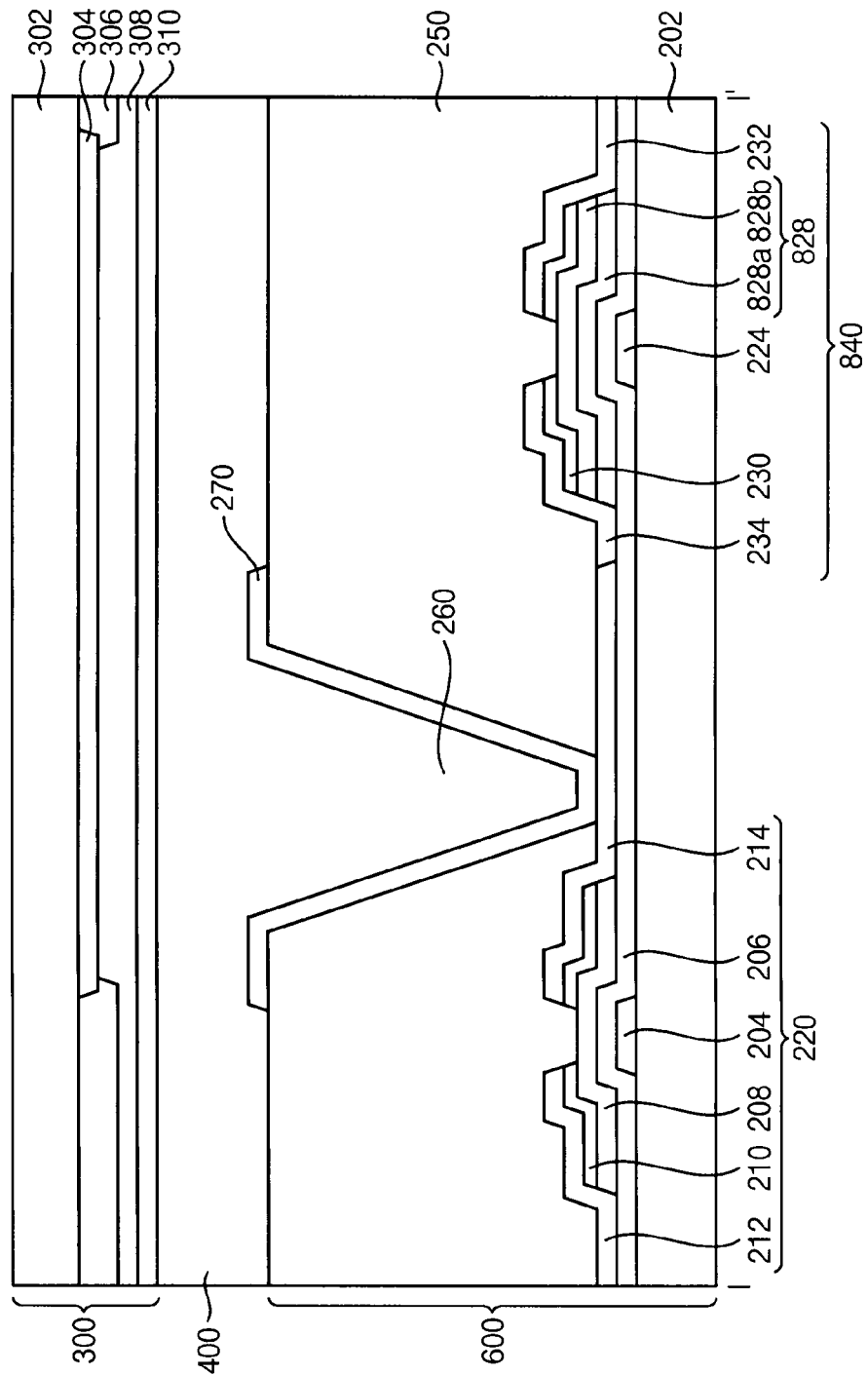
FIG. 6A is a cross-sectional view taken along a line I-I' of FIG. 4 according to exemplary embodiments.
Figure 6B:
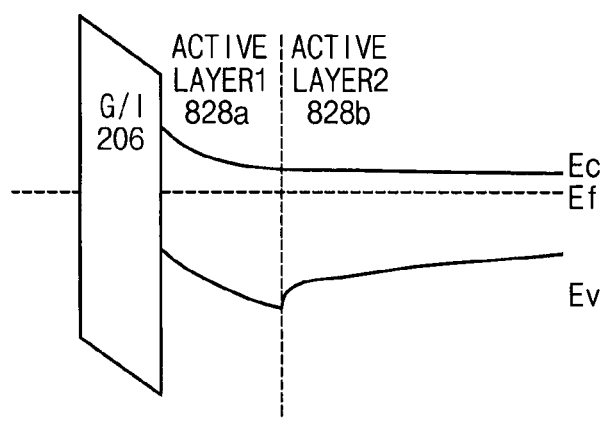
FIG. 6B is a diagram illustrating an exemplary implementation of an energy level according to positions in a second active layer of FIG. 6A.

FIG. 6A is a cross-sectional view taken along a line I-I' of FIG. 4 according to another exemplary embodiment. FIG. 6B is a diagram illustrating an exemplary implementation of an energy level according to positions in a second active layer of FIG. 6A.

Referring to FIGS. 4, 6A and 6B, a display panel may include a lower substrate 600, an upper substrate 300 and a liquid crystal layer 400.

The lower substrate 600 may include a first base substrate 202, a first gate line GL1, a second gate line GL2, a data line DL, a switching TFT 220, a light sensing TFT 840, an organic insulating layer 250, and a pixel electrode 270.

The light sensing TFT 840 may include a second gate electrode 224, a gate insulating layer 206, a second active layer 828, a second ohmic-contact layer 230, a second source electrode 232, and a second drain electrode 234.

The second active layer 828 of the light sensing TFT 840 may include a lower layer 828A and an upper layer 828B.

A work function of the lower layer 828A may be equal to or greater than a work function of the second gate electrode 224. The lower layer 828A may include a material that has a low light reactivity. Thus, the lower layer 828A may include the material that is a stable against light not to be affected by the internal light. In one exemplary embodiment, the lower layer 828A includes an indium gallium zinc oxide (IGZO).

The upper layer 828B may be conductive when the external light is applied to the light sensing TFT 240. The upper layer 828B may include a material of which donor-like state density is high. An intensity of a donor formed in a forbidden band between a balance band and a conductive band of the upper layer 828B may be about $1*10^{17}/cm^3$. The upper layer 828B may include a material that has a high light reactivity to effectively control the grayscale of the pixel according to brightness of the external light. In one exemplary embodiment, the upper layer 828B formed on the lower layer 828A includes a zinc (Zn) and at least one of an indium (In) or a tin (Sn).

A light reactivity of the light sensing TFT 840 may be improved by reducing a bandgap between a conduction band minimum Ec and a valence band maximum Ev of the second active layer 828. The bandgap of the second active layer 828 having the lower layer 828A and the upper layer 828B may be smaller than a bandgap of an active layer that is a single layer. Therefore, the light reactivity of the light sensing TFT 840 may be improved and may efficiently operate as the inverter with the data signal, because the light sensing TFT 840 has the lower layer 828A and the upper layer 828B.

The lower substrate 600 except the second active layer 828, the upper substrate 300, and the liquid crystal layer 400 are described above, duplicated descriptions will be omitted.

Figure 7A:
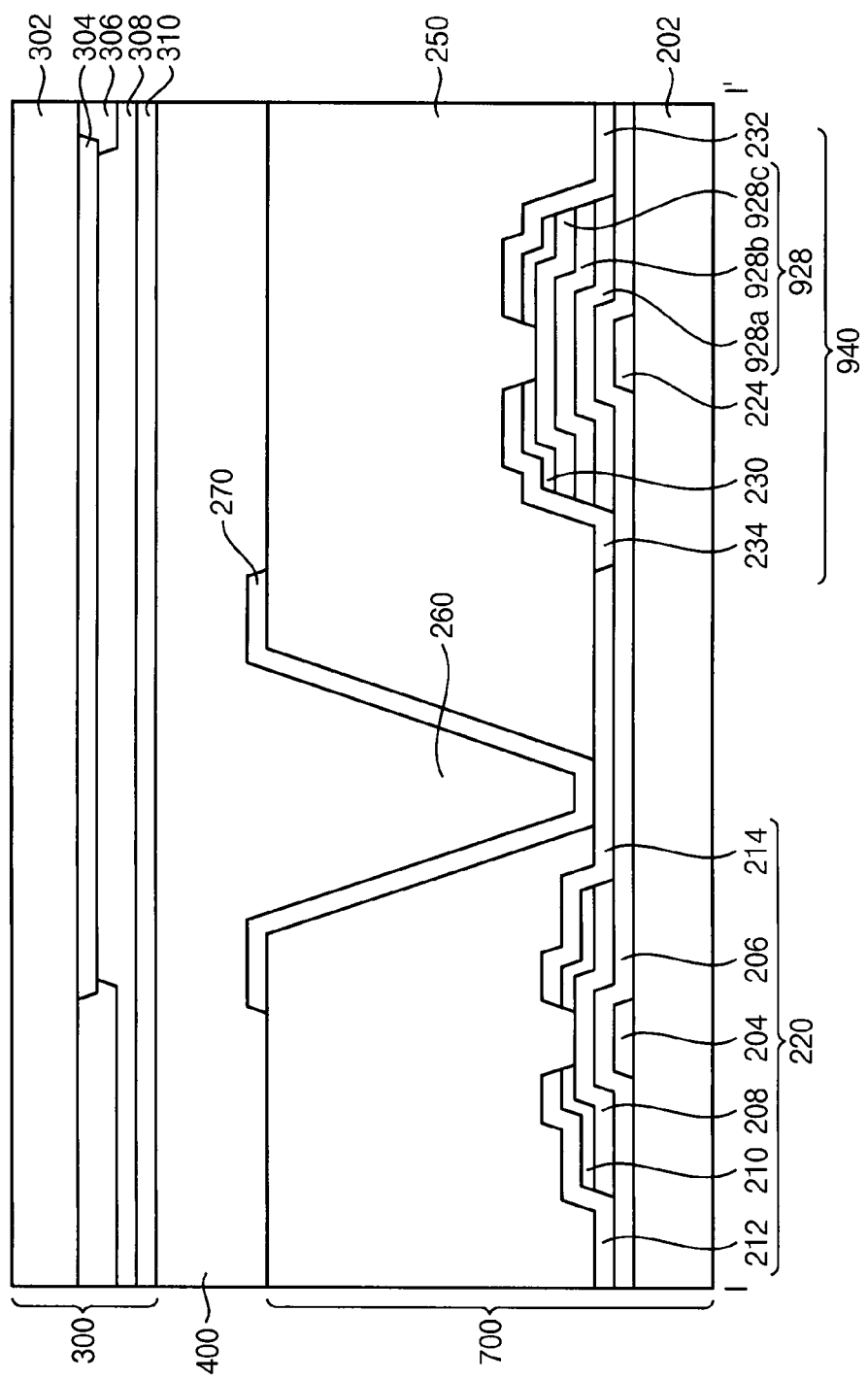
FIG. 7A is a cross-sectional view taken along a line I-I' of FIG. 4 according to exemplary embodiments.
Figure 7B:
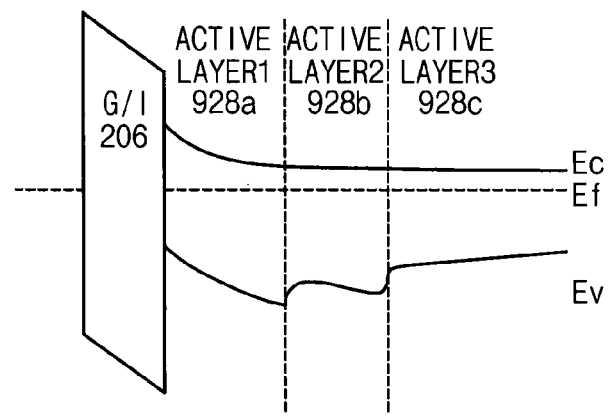
FIG. 7B is a diagram illustrating an exemplary of an energy level according to positions in a second active layer of FIG. 7A.

FIG. 7A is a cross-sectional view taken along a line I-I' of FIG. 4 according to still another exemplary embodiment. FIG. 7B is a diagram illustrating an exemplary implementation of an energy level according to positions in a second active layer of FIG. 7A.

Referring to FIGS. 4, 7A and 7B, a display panel may include a lower substrate 700, an upper substrate 300 and a liquid crystal layer 400.

The lower substrate 700 may include a first base substrate 202, a first gate line GL1, a second gate line GL2, a data line DL, a switching TFT 220, a light sensing TFT 940, an organic insulating layer 250, and a pixel electrode 270.

The light sensing TFT 940 may include a second gate electrode 224, a gate insulating layer 206, a second active layer 928, a second ohmic-contact layer 230, a second source electrode 232, and a second drain electrode 234.

The second active layer 928 of the light sensing TFT 940 may include a lower layer 928A, an intermediate layer 928B, and an upper layer 928C.

A work function of the lower layer 928A may be equal to or greater than a work function of the second gate electrode 224. Also, the lower layer 928A may include a material that has a low light reactivity. Thus, the lower layer 828A may include the material that is a stable against light not to be affected by the internal light. In one exemplary embodiment, the lower layer 928A includes an indium gallium zinc oxide (IGZO).

A first electron affinity of the intermediate layer 928B may be higher than a second electron affinity of the upper layer 928C. Therefore, the second active layer may include the intermediate layer 928B between the lower layer 928A and the upper layer 928C to reduce a bandgap between a conduction band minimum Ec and a valence band maximum Ev of the second active layer 928.

The upper layer 928C may be conductive when the external light is applied to the light sensing TFT 940. The upper layer 928C may include a material of which donor-like state density is high. An intensity of a donor formed in a forbidden band between a balance band and a conductive band of the upper layer 928C may be about $1*10^{17}/cm^3$. The upper layer 928C may include a material that has a high light reactivity to effectively control the grayscale of the pixel according to brightness of the external light. In one exemplary embodiment, the upper layer 928C formed on the intermediate layer 928B includes a zinc (Zn) and at least one of an indium (In) or a tin (Sn).

A light reactivity of the light sensing TFT 940 may be improved by reducing a bandgap between a conduction band minimum Ec and a valence band maximum Ev of the second active layer 928. The bandgap of the light sensing TFT 940 including the second active layer 828 having the lower layer 928A, the intermediate layer 928B and the upper layer 828C may be smaller than a bandgap of a TFT without the intermediate layer 928B. Therefore, the light reactivity of the light sensing TFT 940 may be improved and may efficiently operate as the inverter with the data signal, because the light sensing TFT 940 has the lower layer 828A, the intermediate layer 928B and the upper layer 928C.

The lower substrate 700 except the second active layer 928, the upper substrate 300, and the liquid crystal layer 400 are described above, duplicated descriptions will be omitted.

Figure 8:
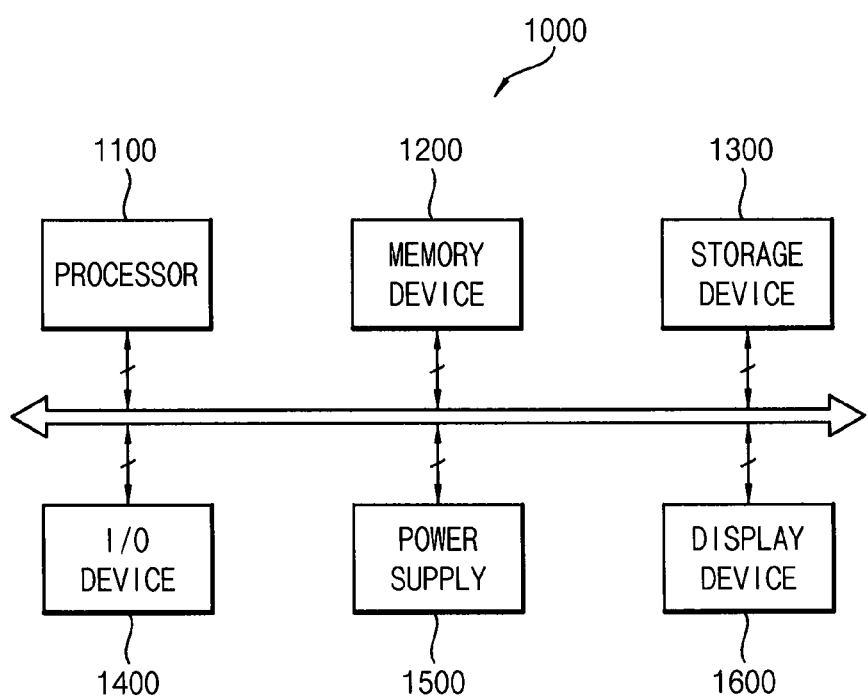
FIG. 8 is an electronic device having a display device according to exemplary embodiments.

FIG. 8 is an electronic device having a display device according to exemplary embodiments.

Referring to FIG. 8, an electronic device 1000 may include a processor 1100, a memory device 1200, a storage device 1300, an input/output (I/O) device 1400, a power supply 1500, and a display device 1600. Here, the electronic device 1000 further includes a plurality of ports for communicating a video card, a sound card, a memory card, a universal serial bus (USB) device, other electronic devices, etc.

The processor 1100 may perform various computing functions. The processor 1100 may be a micro processor, a central processing unit (CPU), etc. The processor 1100 may be coupled to other components via an address bus, a control bus, a data bus, etc. Further, the processor 1100 may be coupled to an extended bus such as a peripheral component interconnection (PCI) bus.

The memory device 1200 may store data for operations of the electronic device 1000. In one exemplary implementation, the memory device 1200 includes at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc.

The storage device 1300 may be a solid state drive (SSD) device, a hard disk drive (HDD) device, a CD-ROM device, etc. The I/O device 1400 may be an input device such as a keyboard, a keypad, a touchpad, a touch-screen, a mouse, etc, and an output device such as a printer, a speaker, etc. The power supply 1500 may provide a power for operations of the electronic device 1000.

The display device 1600 may correspond to the display device 100 of FIG. 1. Therefore, the display device 1600 may control the grayscale of a pixel according to brightness of an external light. In one exemplary embodiment, the display device 1600 increases the pixel voltage applied to the pixel electrode as the brightness of the external light decreases to improve a visibility of the display device 1600. In addition, the display device 1600 may use a light device such as a laser pointer as an input device in parallel with a touch screen panel or instead of the touch screen panel. In another exemplary embodiment, the grayscale of pixels that are exposed to the external light is decreased by inverting the data signals. The inverted data signals may be recognized as input signals. Thus, the display device having 1600 may use the laser pointer as the remote input device that is possible to control the display device without direct touch, because the pixel voltage of the pixel exposed to the external light is inverted. The display device having 1600 may be a transparent display device and the grayscale of pixels exposed to the external light may be decreased. Although it is described above that the present inventive concept is applied to the liquid crystal display (LCD) device, the present inventive concept may also be applied to the organic light emitting display device, etc. Also, the present inventive concept may be applied to various display devices that performs inverter function.

The present inventive concept may be applied to an electronic device having a display device. In one exemplary implementation, the present inventive concept is applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A pixel circuit comprising:
   a switching thin-film transistor (TFT) including i) a first gate electrode electrically connected to a first gate line, ii) a first source electrode electrically connected to a data line, and iii) a first drain electrode directly connected to a pixel electrode; and
   a light sensing TFT including i) a second gate electrode electrically connected to a second gate line, ii) a second source electrode electrically connected to the first gate line, and iii) a second drain electrode directly connected to the first drain electrode and the pixel electrode,
   wherein the light sensing TFT is configured to control the grayscale of a pixel having the pixel electrode based at least in part on brightness of external light.

2. The pixel circuit of claim 1, wherein the light sensing TFT is configured to increase a pixel voltage applied to the pixel electrode as the brightness of the external light decreases, and to decrease the pixel voltage as the brightness of the external light increases.

3. The pixel circuit of claim 1, wherein a gate voltage applied to the second gate electrode has a predetermined voltage level such that the light sensing TFT is turned off when external light incident on the light sensing TFT has a level of intensity lower than a predetermined level.

4. The pixel circuit of claim 3, wherein the gate voltage has a ground voltage level.

5. The pixel circuit of claim 3, wherein the gate voltage has a negative voltage level.

6. The pixel circuit of claim 1, wherein the switching TFT further includes a first active layer, and the light sensing TFT further includes a second active layer, and
   wherein first light reactivity of the first active layer is lower than second light reactivity of the second active layer.

7. The pixel circuit of claim 6, wherein the first active layer is formed at least partially of an indium gallium zinc oxide (IGZO).

8. The pixel circuit of claim 6, wherein the second active layer is conductive when the external light is applied.

9. The pixel circuit of claim 8, wherein the second active layer is a single layer formed at least partially of a zinc (Zn) and at least one of an indium (In) or a tin (Sn).

10. The pixel circuit of claim 8, wherein the second active layer includes
    a lower layer formed at least partially of an IGZO; and
    an upper layer formed on the lower layer, the upper layer formed at least partially of a zinc (Zn) and at least one of an indium (In) or a tin (Sn).

11. The pixel circuit of claim 10, wherein the second active layer further includes an intermediate layer between the lower layer and the upper layer, and
    wherein a first electron affinity of the intermediate layer is higher than a second electron affinity of the upper layer.

12. A display device comprising:
a display panel having a plurality of pixel circuits;
a scan driving unit configured to provide a scan signal to the pixel circuits;
a data driving unit configured to provide a data signal to the pixel circuits; and
a timing control unit configured to control the scan driving unit and the data driving unit,
wherein each of the pixel circuits comprises:
- a switching TFT including i) a first gate electrode electrically connected to a first gate line, ii) a first source electrode electrically connected to a data line, and iii) a first drain electrode directly connected to a pixel electrode; and
- a light sensing TFT including i) a second gate electrode electrically connected to a second gate line, ii) a second source electrode electrically connected to the first gate line, and iii) a second drain electrode directly connected to the first drain electrode and the pixel electrode, wherein the light sensing TFT is configured to control the grayscale of a pixel having the pixel electrode according to brightness of external light.

13. The display device of claim 12, wherein the light sensing TFT is configured to increase a pixel voltage applied to the pixel electrode as the brightness of the external light decreases, and to decrease the pixel voltage as the brightness of the external light increases.

14. The display device of claim 12, wherein a gate voltage applied to the second gate electrode has a predetermined voltage level such that the light sensing TFT is turned off when external light incident on the light sensing TFT has a level of intensity lower than a predetermined level.

15. The display device of claim 12, wherein the switching TFT further includes a first active layer, and wherein the light sensing TFT further includes a second active layer that is conductive when the external light is applied.

16. The display device of claim 15, wherein the second active layer includes
- a lower layer formed at least partially of an IGZO; and
- an upper layer formed on the lower layer, the upper layer formed at least partially of a zinc (Zn) and at least one of an indium (In) or a tin (Sn).

17. The display device of claim 16, wherein the second active layer further includes an intermediate layer between the lower layer and the upper layer, and
wherein a first electron affinity of the intermediate layer is higher than a second electron affinity of the upper layer.

* * * * *